(12) United States Patent
Song

(10) Patent No.: US 6,388,263 B1
(45) Date of Patent: May 14, 2002

(54) VACUUM SYSTEM WITH MIST PREVENTION APPARATUS FOR MANUFACTURING SEMICONDUCTOR DEVICES AND METHOD USING THE SAME

(75) Inventor: Ho-gi Song, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/309,282

(22) Filed: May 11, 1999

(30) Foreign Application Priority Data

Jul. 9, 1998 (KR) .............................. 98-27694

(51) Int. Cl.⁷ .............................. A61N 5/00; G21K 5/10
(52) U.S. Cl. .............................. 250/492.21
(58) Field of Search .................... 250/492.21; 414/217; 118/729

(56) References Cited

U.S. PATENT DOCUMENTS

| | | | | |
|---|---|---|---|---|
| 5,731,592 A | * | 3/1998 | Oh et al. ............... | 250/492.21 |
| 5,833,425 A | * | 11/1998 | Jeon et al. .............. | 414/217 |
| 6,025,602 A | * | 2/2000 | Rose et al. ............. | 250/492.21 |
| 6,042,623 A | * | 3/2000 | Edwards ................ | 29/25.01 |
| 6,071,350 A | * | 6/2000 | Jeon et al. .............. | 118/719 |
| 6,120,606 A | * | 9/2000 | Peng ..................... | 118/719 |

* cited by examiner

Primary Examiner—Jack Berman
Assistant Examiner—Johnnie L. Smith, II
(74) Attorney, Agent, or Firm—Volentine Francos, PLLC

(57) ABSTRACT

A vacuum system for manufacturing semiconductor devices and a method of using the same increase the production yield of wafers by preventing contamination due to mist formation inside chambers, and minimizing production of inferior wafers. The vacuum system has a vent gas supply apparatus for supplying a vent gas into a chamber in the vacuum state so as to form an atmospheric state therein, so as to prepare the chamber for opening to the outside. The vent gas supply apparatus includes a heater for preheating the vent gas. The method includes supplying a vent gas into the chamber, which is sealed with a vacuum state after completing a process; unloading the processed wafers from the chamber while the vent gas is continuously supplied; loading wafers to be processed into the chamber while the vent gas is continuously supplied; and forming a vacuum inside the chamber after sealing the chamber and shutting off the supply of the vent gas. The supply of preheated vent gas prevents outside air from entering the chamber while it is being loaded and unloaded, and prevents mist formation inside the chamber due to a sudden formation of a vacuum and a sudden temperature change.

6 Claims, 7 Drawing Sheets

VACUUM SYSTEM WITH MIST PREVENTION APPARATUS FOR MANUFACTURING SEMICONDUCTOR DEVICES AND METHOD USING THE SAME

BACKGROUND OF THE INVENTION

1. Field of the Invention

The present invention relates to a vacuum system for manufacturing semiconductor devices, and more particularly, to a vacuum system which prevents the generation of mist inside a chamber in which a vacuum is being formed, and a method for using the same.

2. Background of the Related Art

Semiconductor device fabrication involves various highly-precise process steps, and the fabrication facility must be equipped to provide a high vacuum state. In order to create and maintain an appropriate degree of vacuum state, vacuum systems are provided for each process according to its process characteristics, for example, an etching process using plasma, a diffusion process to diffuse impurities into a wafer, an ion implantation process to implant impurities into the wafer, and the like.

The vacuum systems for the above mentioned semiconductor device fabrication processes employ various types of vacuum pumps for providing a low vacuum state, a high vacuum state, an ultra high vacuum state, etc., according to the process conditions and the required degree of vacuum.

The vacuum pump functions to absorb the air inside a chamber and to forcibly discharge it outside of the chamber. Typically, a low vacuum pump and a high vacuum pump are installed inside a single chamber, in order to provide gradual formation of a vacuum state.

A conventional vacuum system is constructed such that a connection line is connected to a vacuum pump inside the sealed chamber; and a valve is installed on the connection line and is controlled by a controlling part. The vacuum system is operated in such a manner that the connection line is opened after the chamber is sealed, and the vacuum pump absorbs the air inside the chamber so as to form a vacuum state inside the chamber.

In other words, a low vacuum pump (for example, a dry pump) and a high vacuum pump (for example, a cryo pump) are connected to the chamber via connection lines, and tile valves provided on each of the connection lines are gradually opened. On the other hand, the chamber is prepared for opening to the outside by converting the vacuum state into an atmospheric state, by supplying a vent gas into the chamber in the vacuum state and forming an atmospheric state inside the chamber. Supplying the vent gas prepares the chamber for opening to the outside by increasing the pressure therein to the atmospheric state.

However, at the moment that the valve on the connection line connecting the chamber to the low vacuum pump is opened, the inside of the chamber is abruptly converted into a vacuum state, and mist forms inside the chamber in the form of fine liquid drops, thereby contaminating the inside of the chamber, and damaging the wafers mounted therein.

The mist is formed when vapors in the air in the form of gases condense into drops at a saturation point occurring when the pressure inside the chamber decreases abruptly and the temperature abruptly falls. The drops attach to the surface of the wafer, seriously damaging the wafer.

SUMMARY OF THE INVENTION

The present invention is directed to a vacuum system for manufacturing semiconductor devices and a method of using the same, which substantially overcome one or more of the problems of the related arts, and increase the production yield of the wafers by preventing contamination inside chambers due to mist formation, and minimizing the production of the inferior wafers.

To achieve these and other advantages and in accordance with the purpose of the present invention, as embodied and broadly described, the vacuum system for manufacturing semiconductor devices has a vent gas supply apparatus for supplying a vent gas into a chamber in the vacuum state so as to form an atmospheric state required for the opening of the chamber to the outside. The apparatus comprises a heater for preheating the vent gas; a vent gas source for storing the vent gas; a vent gas supply line for transferring the vent gas stored in the vent gas source to the chamber; a valve for opening the vent gas supply line; and a controlling part for controlling the valve by applying an on/off signal to the valve.

In addition, the heater comprises a heating coil for supplying heat to the vent gas with an applied power; and a controlling part for controlling the temperature of the heating coil to be maintained constant. The apparatus may also include a heater installed on the inner wall of the chamber for preventing the generation of liquid drops inside the chamber when the inside of the chamber is converted into the vacuum state.

A method of using a vacuum system of the present invention comprises the steps of preheating the vent gas; supplying the vent gas into the chamber which is sealed with a vacuum state; shutting off the supply of the vent gas; opening the chamber to the outside; unloading processed wafers from the chamber; loading wafers to be processed into the chamber; and forming a vacuum inside the chamber after sealing the chamber. In addition, the vent gas can be continuously supplied while the chamber is opened to the outside, and while the chamber is unloaded and reloaded with wafers.

It is to be understood that both the foregoing general description and the following detailed description are exemplary and explanatory and are intended to provide further explanation of the invention as claimed.

BRIEF DESCRIPTION OF THE ATTACHED DRAWINGS

These and other objects, features and advantages of the present invention will be described with reference to the accompanying drawings. The drawings, which are included to provide a farther understanding of the invention and are incorporated in and constitute a part of this specification, illustrate embodiments of the invention in which.

DETAILED DESCRIPTION OF PREFERRED EMBODIMENTS

Figure 1:
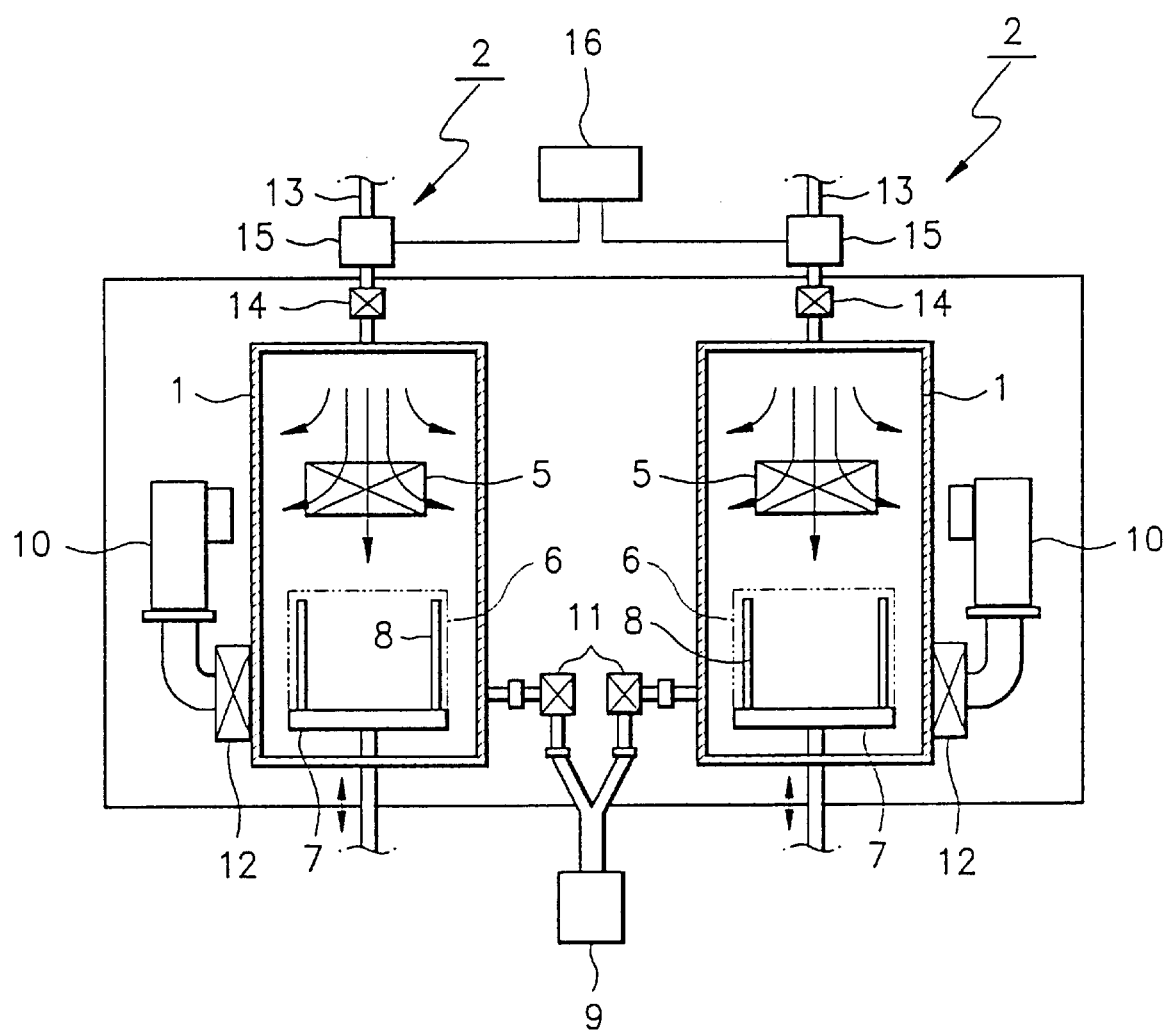
FIG. 1 is a schematic view showing a vacuum system for manufacturing semiconductor devices according to one embodiment of the present invention.

Preferred embodiments of the present invention will now be described in detail with reference to the accompanying drawings. Generally, referring to FIG. 1, the vacuum system comprises a vent gas supply apparatus for supplying a vent gas from a vent gas source (not shown) into a load lock chamber 1 in the vacuum state so as to form an atmospheric state inside the load lock chamber 1 in preparation for opening to the outside. A heater 2 is provided in the vent gas supply apparatus for preheating the vent gas, in order to prevent generation of mist inside the load lock chamber. The heater 2 is described in more detail later.

Figure 2:
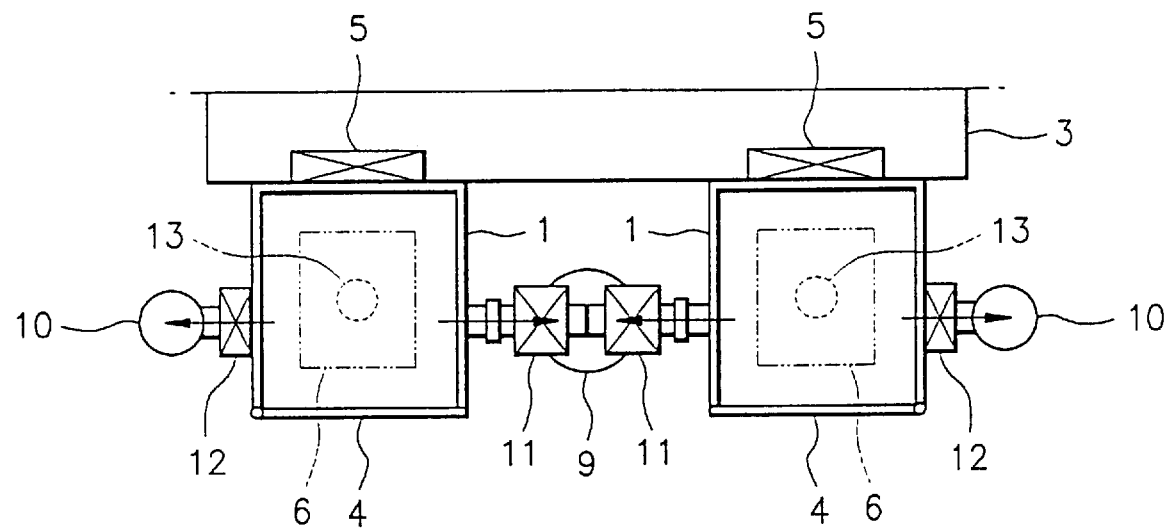
FIGS. 2 to 7 are schematic views of the vacuum system of FIG. 1, sequentially showing its operation states.

This embodiment of the present invention shows the load lock chamber 1 being used as a stand-by place for wafers, and being connected to a process chamber 3, as shown in FIG. 2. The process chamber 3 in this embodiment is used for an ion implantation process, which requires a high vacuum state. FIG. 2 shows two load lock chambers 1 installed on the front of the process chamber 3. A door 4 is provided on the front of the load lock chamber 1 as shown in FIG. 2, and a shutter 5 is provided on one side of the load lock chamber 1 through which to transfer wafers.

A transfer arm (not shown) is provided inside the process chamber 3 so as to transfer wafers through the shutter 5, and a cassette elevator 7 is provided in the load lock chamber 1 so as to move up and down for transferring a cassette having wafers therein to the transfer arm.

Here, for the loading of the cassette 6, the door of the load lock chamber 1 is open, the cassette 6 is mounted on a cassette hanger 8 provided on the cassette elevator 7, and the cassette hanger 8 moves the cassette 6 into the load lock chamber 1.

A low vacuum pump 9 and a high vacuum pump 10 are installed on the load lock chamber 1, each having a respective vacuum line. Valves 11, 12 are installed on each vacuum line for opening and closing thereof.

In addition, valves 11, 12 are controlled by a controlling part (not shown) of the facility, and the valves 11,12 are controlled by steps according to a set program. A low vacuum is formed inside the load lock chamber 1 using the low vacuum pump 9, and then, a high vacuum is formed using the high vacuum pump 10.

Meanwhile, an inert gas, preferably nitrogen gas ($N_2$), is used as a vent gas in order to minimize possible damage to the wafers. The vent gas is supplied by the vent gas supply apparatus comprising the vent gas source (not shown), a vent gas supply line 13 through which the vent gas stored in the vent gas source is supplied to the load lock chamber, a valve 14 for opening the vent gas supply line 13, and a controlling part (not shown) for controlling the valve 14 by applying an on/off signal to the valve 14.

In addition, the heater 2 comprises a heating coil 15 for supplying heat to the vent gas passing through the vent gas supply line 13, and a controlling part 16 for maintaining the heating coil 15 at a constant temperature. The heating coil 15 is preferably constructed to encompass the vent gas supply line 13. Any suitable heating device know to those of ordinary skill in the art may be incorporated within the present invention.

If the valve 14 of the vent gas supply apparatus is opened by the controlling part, the vent gas passes through the vent gas supply line 13, is preheated by the heating coil 15, and then is introduced into the load lock chamber 1 in a vacuum state. The vent gas at high temperature fills the load lock chamber 1 and increases the inner pressure and temperature thereof, thereby preventing condensation of vapors due to a sudden decrease in the inner temperature when the load lock chamber 1 is opened to the outside.

In particular, when the supply of the vent gas causes the inner pressure inside the load lock chamber 1 to reach a certain level, the valve 14 is closed, and the supply of the vent gas is shut off. The door 4 of the load lock chamber 1 is opened, the cassette 6 having processed wafers is unloaded from the load lock chamber 1, another cassette 6 having wafers to be processed is loaded into the load lock chamber 1, the door 4 of the load lock chamber 1 is sealed, and a low vacuum state and a high vacuum state are then sequentially formed inside the load lock chamber 1.

Preferably, in order to enhance the prevention of vapor condensation, the valve 14 of the vent gas supply line 13 remains open while the load lock chamber 1 is open to the outside, so as to continuously supply the vent gas. In this case, outside air is prevented from being introduced into the load lock chamber 1 even while the load lock chamber 1 is open to the outside by continuously supplying the vent gas at high temperature into the load lock chamber 1. Therefore, vapor is not introduced into the load lock chamber 1, which vapor is the source of mist; so mist formation is prevented.

Operation of one preferred embodiment of the present invention is described below in reference to FIG. 2 to FIG. 7. First, valve 11 of the vacuum line connected to low vacuum pump 9 is opened so as to form a low vacuum inside the load lock chamber 1. Then, by opening valve 12 of the vacuum line connected to high vacuum pump 10, the inside of the load lock chamber 1 is put into the high vacuum state.

Figure 3:
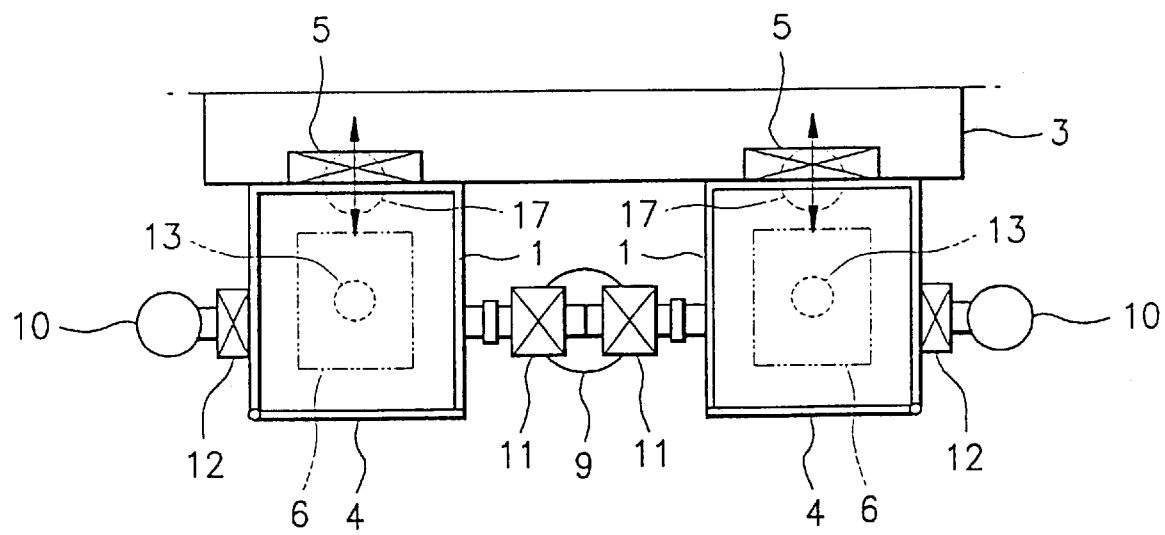

Then, as shown in FIG. 3, when the vacuum level inside the load lock chamber 1 reaches the same vacuum level as inside the process chamber 3, a transfer arm installed inside the process chamber 3 moves through the shutter 5, transferring wafers 17 into the process chamber 3 where the wafers 17 are processed.

Figure 4:
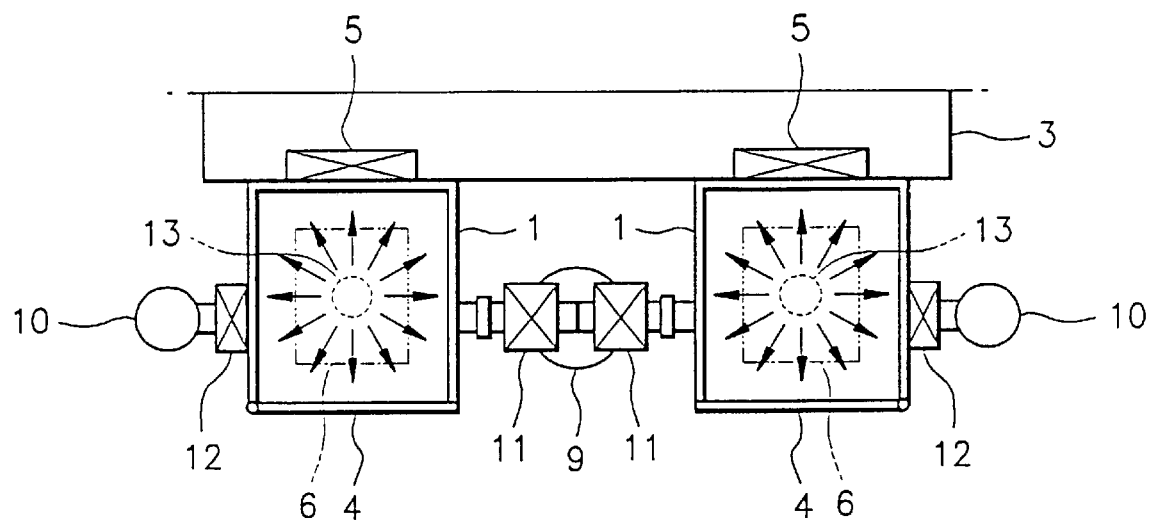

When processing of the wafers 17 is completed, the wafers 17 are unloaded into the load lock chamber 1 by the transfer arm. During the loading and unloading of the wafers 17, the cassette elevator 7 moves up and down, bringing the wafers 17 to the transfer arm. Then, as shown in FIG. 4, the shutter 5 is closed, and the vent gas is supplied into the load lock chamber 1 so as to increase the inner pressure therein.

Figure 5:
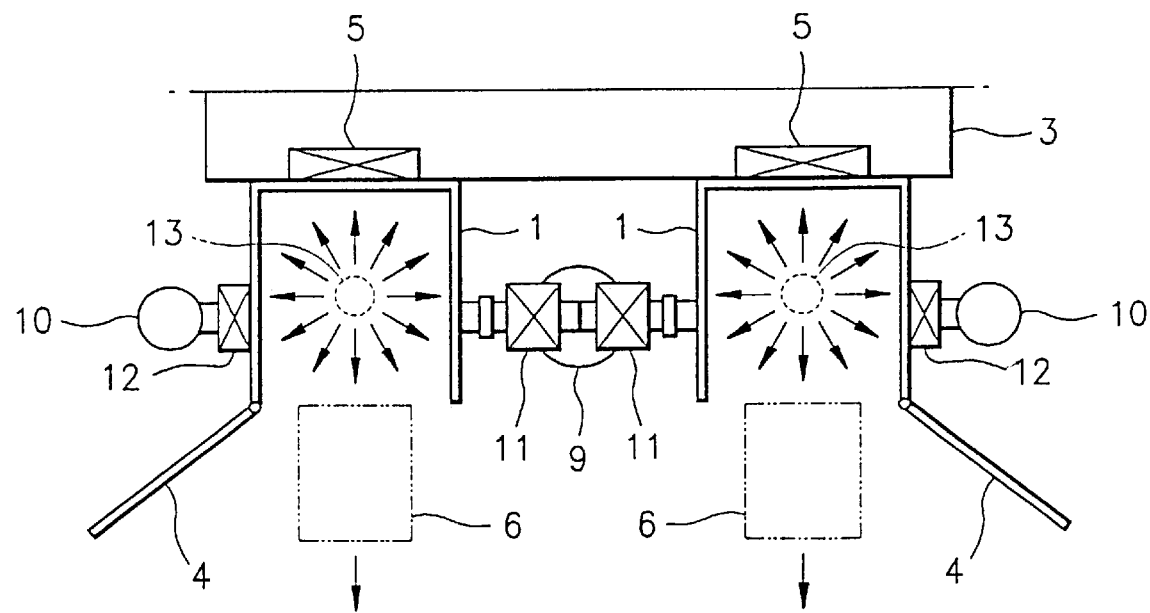
Figure 6:
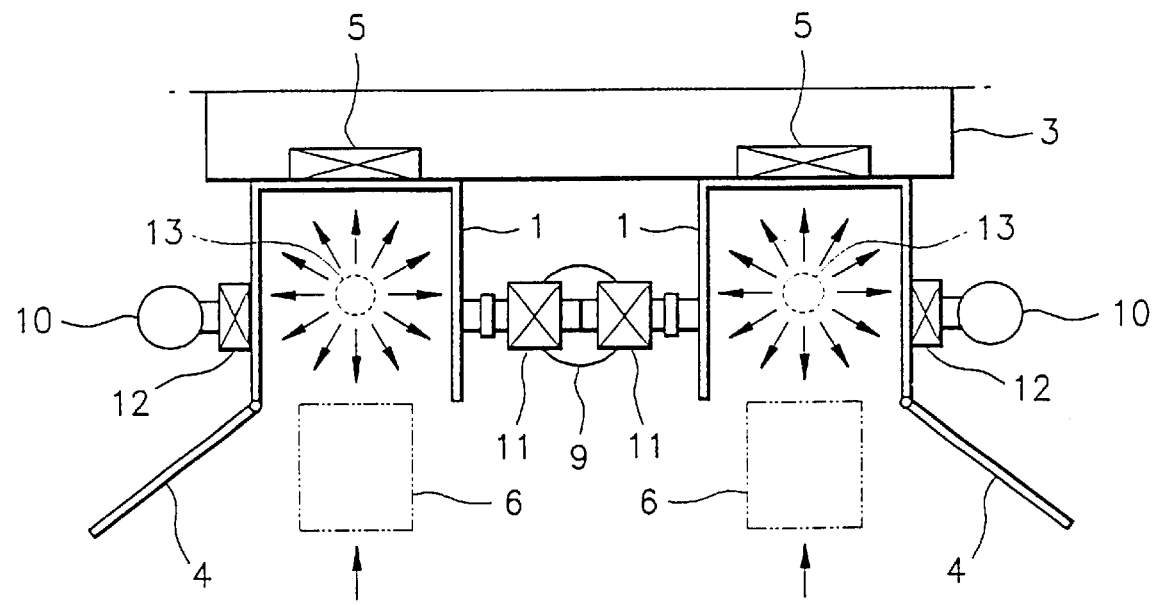
Figure 7:
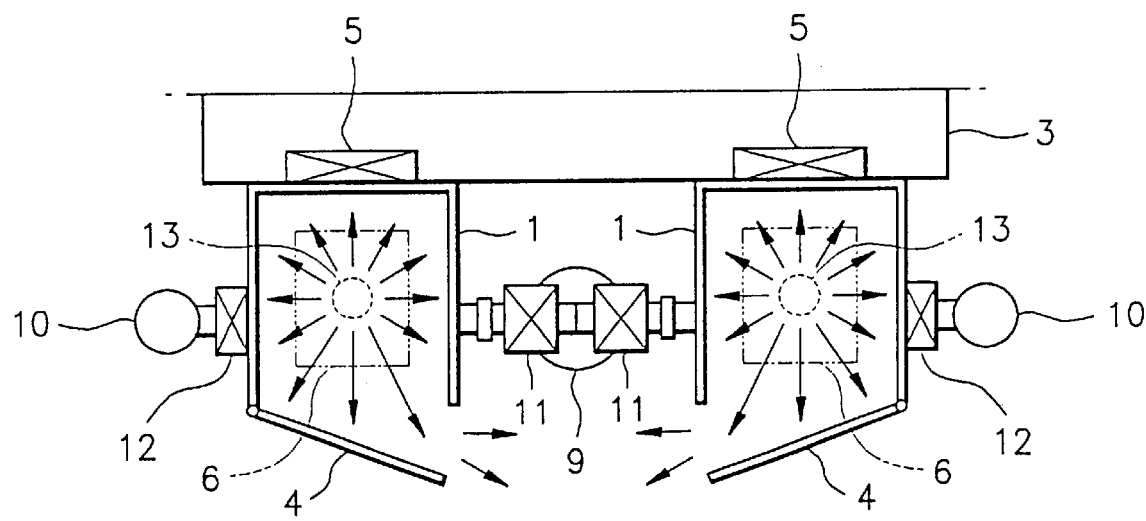

As shown in FIG. 5, when the pressure level inside the load lock chamber 1 reaches the atmospheric pressure level, the door 4 of the load lock chamber 1 is opened while the vent gas is continuously supplied, and the plurality of processed wafers are unloaded by the operation of an operator. Then, as shown in FIG. 6, as the vent gas continues to be supplied, the cassette 6 having a plurality of wafers to be processed is loaded into the load lock chamber 1, and as shown in FIG. 7, the door 4 of the load lock chamber 1 is closed.

After the door 4 of the load lock chamber 1 is closed, the supply of the vent gas stops, and as shown in FIG. 2, the valves 11, 12 of the vacuum line connected to the low vacuum pump 9 and the high vacuum pump 10 are opened sequentially so that the inside of the load lock chamber 1 is converted from a low vacuum to a high vacuum step-by-step. The process as described above can be carried out by repeating the above steps.

Therefore, introduction of outside air including vapor into the load lock chamber 1 while the door 4 is open, can be prevented by supplying the vent gas, and also, the amount of saturated vapor generated due to the abrupt formation of the vacuum can be reduced, whereby formation of mist can be prevented.

Figure 8:
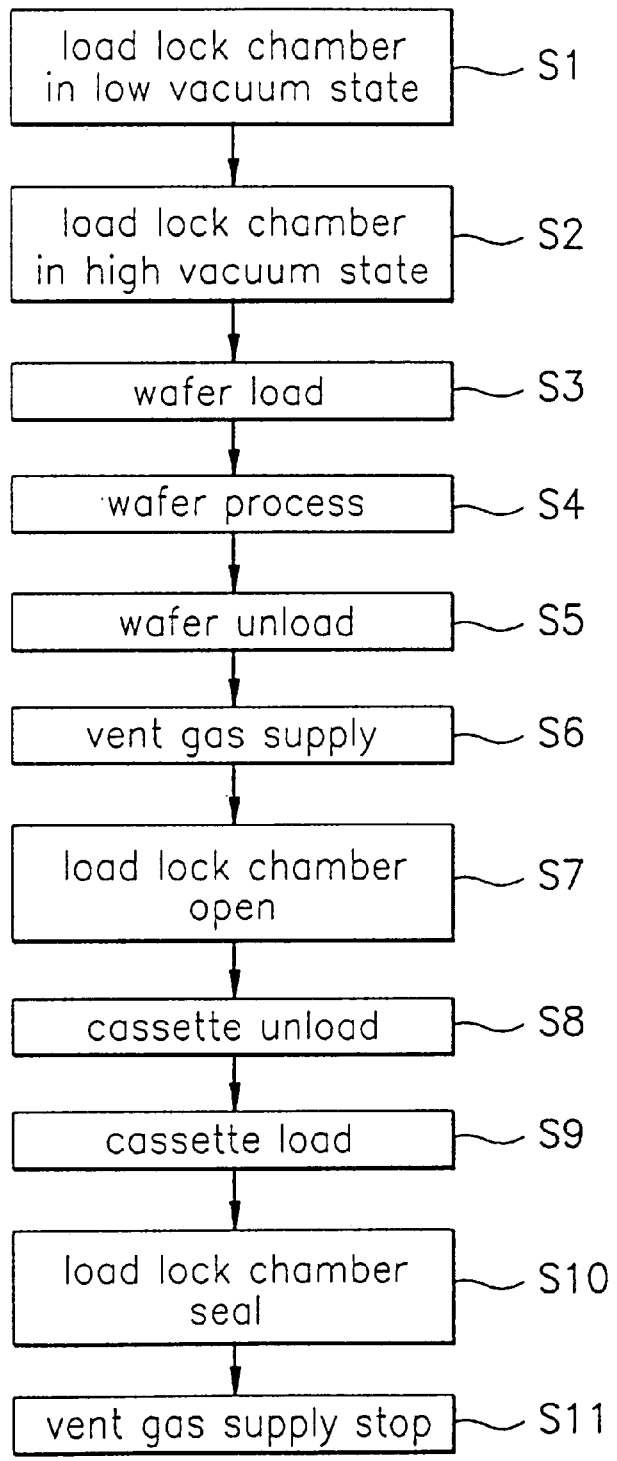
FIG. 8 is a flow chart showing a method of operating the vacuum system of FIG. 1.

A method of using the vacuum system of the present invention comprises the steps of, as shown in FIG. 8, forming a low vacuum state inside the load lock chamber (S1); forming a high vacuum state inside the load lock chamber (S2); loading wafers into the process chamber by the transfer arm inside the process chamber through the shutter when the load lock chamber is in the same vacuum state as the process chamber (S3); carrying out a specific process after loading the wafers (S4); unloading the processed wafers into the load lock chamber by the transfer arm (S5); supplying the vent gas into the load lock chamber in a vacuum state after the shutter is closed (S6); opening the load lock chamber to the outside while continuously supplying the vent gas (S7); unloading the cassette having the plurality of processed wafers from the load lock chamber (S8); loading the cassette with a plurality of wafers to be processed into the load lock chamber while continuously supplying the vent gas (S9); and shutting off the supply of the vent gas after the load lock chamber is sealed (S10, S11).

After stopping the supply of the vent gas (S11), the load lock chamber starts to be returned to the low vacuum state (S1), and the above steps are repeated. Therefore, the ion implantation process can be carried out for a plurality of wafers by repeating the above steps.

In the meantime, for the method using the vacuum system of the present invention, the supply time of the vent gas is controlled and the vent gas is preheated using a heater to enhance the prevention of vapor condensation.

The preheating temperature of the vent gas is maintained preferably at a minimum temperature which is just enough to prevent mist formation. The minimum temperature to prevent mist can be readily determined by one of ordinary skill in the art, taking into account the flow amount of the vent gas, the size of the chambers, the sealing of the chambers, the temperature of the outside air, and the like.

Figure 9:
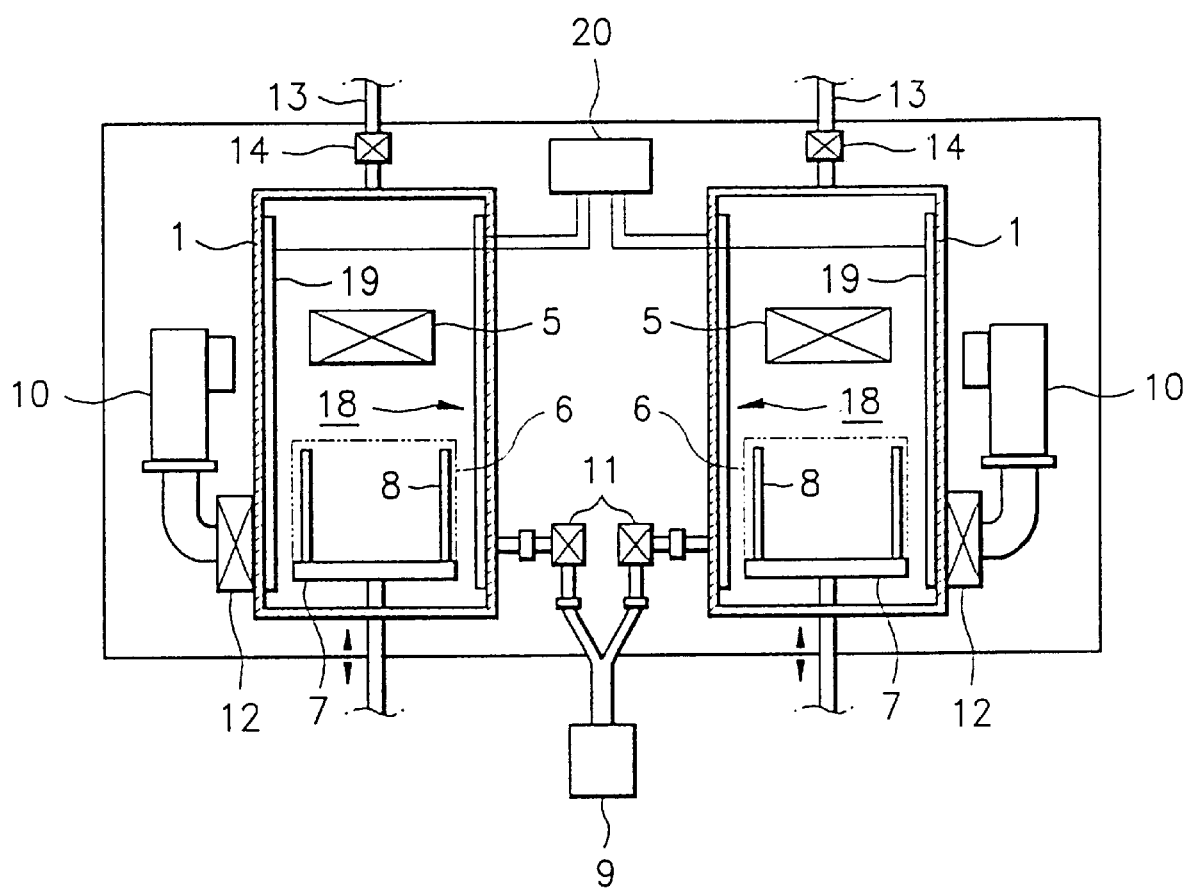
FIG. 9 is a schematic view showing a vacuum system for manufacturing semiconductor devices according to another embodiment of the present invention.

A further embodiment of the vacuum system of the present invention, as shown in FIG. 9, further comprises a heater 18 on the inner wall of the load lock chamber 1. This heater 18 helps to prevent liquid drops from being generated during the formation of the vacuum inside the load lock chamber 1.

The heater 18 comprises a heating coil 19 for generating heat energy to be supplied into the load lock chamber 1 with applied power, and a controlling part 20 for controlling the temperature of the heating coil 19. The installation method of the heating coil 19 can be modified in various ways, for example, by installing the heating coil 19 on a heating plate attached to the inner wall of the load lock chamber 1, by installing the heating coil 19 on a heating rod attached to the inner wall of the load lock chamber 1, by installing the heating coil to encompass the inner wall of the load lock chamber 1, and the like.

In addition, the controlling part 20 controls the heating coil 19 so as to maintain the heating coil 19 at a constant temperature, or the heating coil 19 can be controlled to be heated only during the opening of the load lock chamber 1 to the outside. Therefore, mist formation can be prevented, and further, the temperature-controlling feature of the load lock chamber allows an operator to maintain an optimized temperature for the wafers after various processes such as ion implantation, etc. are completed, since the temperature of the load lock chamber can be controlled.

Figure 10:
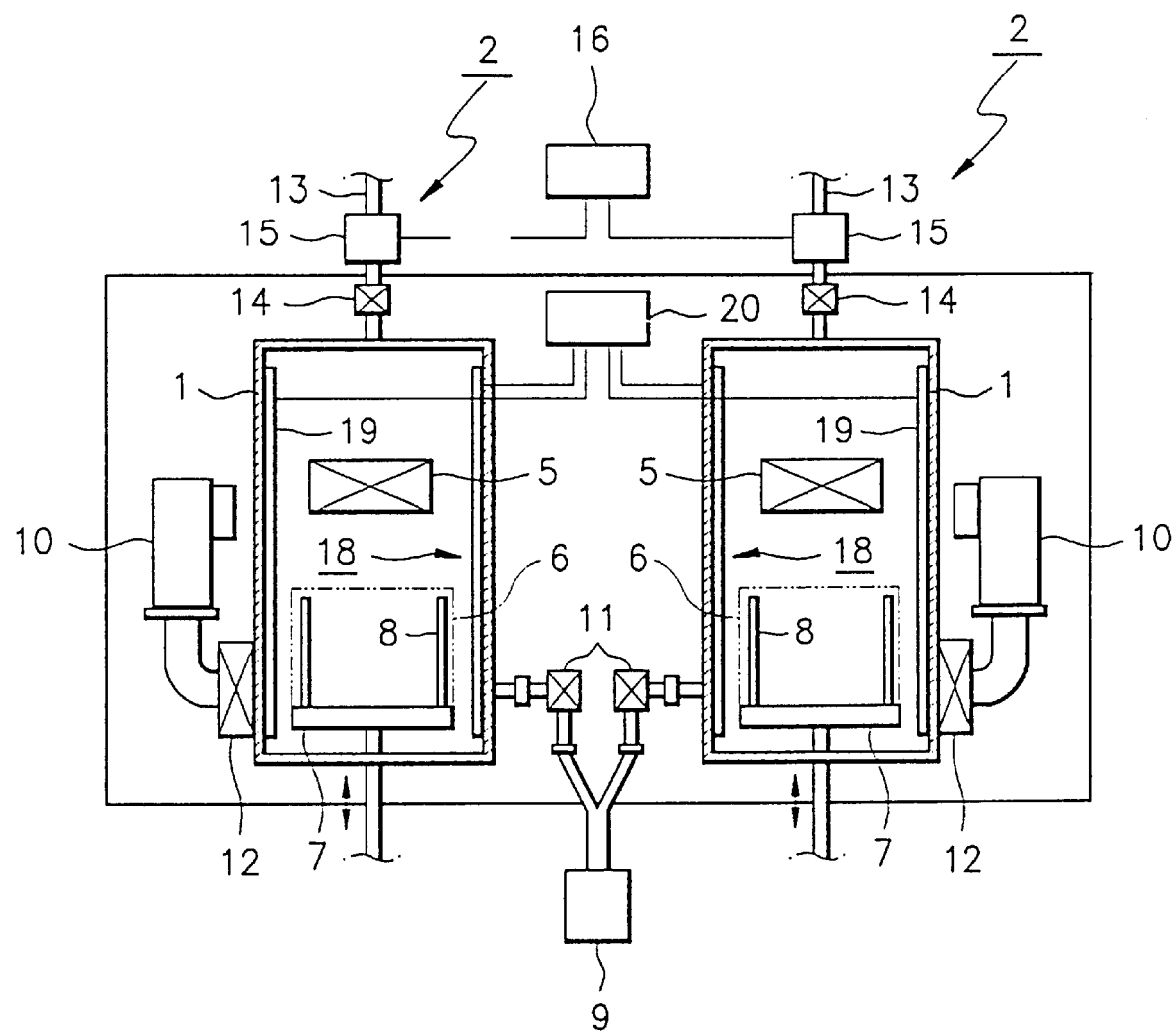
FIG. 10 is a schematic view showing a vacuum system for manufacturing semiconductor devices according to another embodiment of the present invention.

Although the heater 2 to preheat the vent gas and the heater 18 to heat the inside of the load lock chamber are disclosed as separate embodiments, they can be employed in the load lock chamber 1 simultaneously as shown in FIG. 10. In this embodiment, the load lock chamber 1 comprises the heater 2 and the heater 18, wherein the heater 2 preheats the vent gas from the vent gas supply apparatus, and the heater 18 is installed in the inside wall of the load lock chamber 1. Here, there are provided heating coils 15, 19 for supplying heat inside the load lock chamber 1 with applied power, and corresponding controlling parts 16, 20 for maintaining the temperature of the heating coils 15, 19.

Accordingly, by the vacuum system for manufacturing semiconductor devices of the present invention, and the method of using it, the prevention of mist formation can be enhanced, and as result, the temperature in the load lock chamber is controlled so as to maintain the optimized temperature of the wafers after completion of processes such as ion implantation. Therefore, the production of inferior wafers can be minimized by preventing the contamination of the chamber due to liquid drops, thereby increasing the production yield.

Still further, while the present invention has been described in detail, it should be understood that various changes, substitutions and alterations can be made hereto without departing from the spirit and scope of the invention as defined by the appended claims.

What is claimed is:

1. A vacuum system for use in manufacturing semiconductor devices, comprising:

a load-lock chamber having an inner wall, and an opening to the outside;

a door disposed over said opening and being openable and closable to open and close the interior of the load-lock chamber to the outside;

a shutter leading to a processing chamber in which semiconductor wafers are processed;

at least one vacuum pump connected to said load-lock chamber to create a vacuum in the load-lock chamber;

a vent gas supply apparatus, connected to said load-lock chamber, for supplying a vent gas into said load-lock chamber in preparation for the opening of said door;

a first heating element integrated with said vent gas supply apparatus;

a second heating element disposed on the inner wall of said load-lock chamber; and a controller operatively connected to said first and second heating elements so as to operate said first heating element to pre-heat the vent gas before the vent gas enters said load-lock chamber, and so as to operate said second heating element to regulate the temperature in said load-lock chamber after wafers are processed in the processing chamber to maintain a temperature of the wafers once the wafers are located back in said load-lock chamber after having been processed.

2. The vacuum system of claim 1, wherein said first heating element comprises a heating coil.

3. The vacuum system of claim 1, wherein said second heating element comprises a heating coil.

4. The vacuum system of claim 3, wherein said second heating element comprises a heating plate attached to the inner wall of said load-lock chamber, said heating coil being integrated with said heating plate.

5. The vacuum system of claim 3, wherein said second heating element comprises a heating rod attached to the inner wall of said load-lock chamber, said heating coil being integrated with said heating rod.

6. The vacuum system of claim 3, wherein said heating coil encompasses the inner wall of said load-lock chamber.

* * * * *